(12) United States Patent
Araki et al.

(10) Patent No.: US 10,617,019 B2
(45) Date of Patent: Apr. 7, 2020

(54) BOARD HOLDING APPARATUS

(71) Applicant: AISIN AW CO., LTD., Anjo-shi, Aichi-ken (JP)

(72) Inventors: Hiroyoshi Araki, Nagoya (JP); Yuichi Takeuchi, Toyokawa (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 16/328,115

(22) PCT Filed: Jun. 20, 2017

(86) PCT No.: PCT/JP2017/022659
§ 371 (c)(1),
(2) Date: Feb. 25, 2019

(87) PCT Pub. No.: WO2018/061343
PCT Pub. Date: Apr. 5, 2018

(65) Prior Publication Data
US 2019/0191573 A1 Jun. 20, 2019

(30) Foreign Application Priority Data
Sep. 30, 2016 (JP) .................................. 2016-193571

(51) Int. Cl.
*H05K 5/00* (2006.01)
*H05K 5/02* (2006.01)
*H05K 7/14* (2006.01)

(52) U.S. Cl.
CPC ........... *H05K 5/006* (2013.01); *H05K 5/0069* (2013.01); *H05K 5/0221* (2013.01); *H05K 7/14* (2013.01); *H05K 7/1417* (2013.01)

(58) Field of Classification Search
USPC ........................................................ 361/759
See application file for complete search history.

(56) References Cited

U.S. PATENT DOCUMENTS 4,912,602 A * 3/1990 Zurek .................. H04B 1/3833
361/752
9,541,967 B1 * 1/2017 Chen .................... G11B 33/025
(Continued)

FOREIGN PATENT DOCUMENTS

JP H04-5688 U 1/1992
JP H06-13195 U 2/1994
(Continued)

OTHER PUBLICATIONS

Sep. 19, 2017 International Search Report issued in International Application No. PCT/JP2017/022659.

*Primary Examiner* — Hung S. Bui
(74) *Attorney, Agent, or Firm* — Oliff PLC

(57) ABSTRACT

A board holding apparatus holds an electric circuit board between a first case and a second case. The board holding apparatus includes locking parts that lock the first case and the second case together in a thickness direction of the electric circuit board such that the first case and the second case are not separated from each other and a bearing surface formed on the second case, the electric circuit board coming into contact with the bearing surface in the thickness direction. The board holding apparatus includes a spring that generates an elastic force, with the locking parts locking the first case and the second case together, the spring being formed on the first case and the elastic force pressing the bearing surface through the electric circuit board.

9 Claims, 7 Drawing Sheets

(56) References Cited

U.S. PATENT DOCUMENTS

2001/0028555 A1   10/2001  Takeuchi
2016/0044799 A1*  2/2016  Igari .................... H05K 5/006
                                              361/752

FOREIGN PATENT DOCUMENTS

| | | |
|---|---|---|
| JP | H06-17286 U | 3/1994 |
| JP | H10-303590 A | 11/1998 |
| JP | 2001-244656 A | 9/2001 |
| JP | 2001-352182 A | 12/2001 |

* cited by examiner

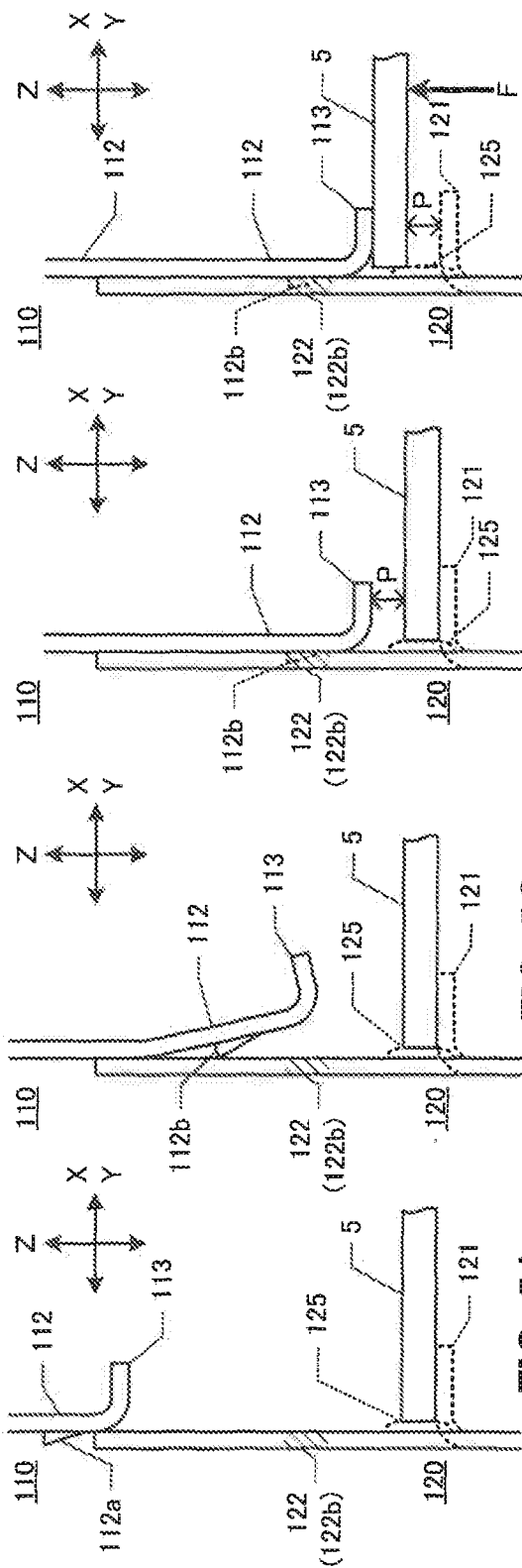
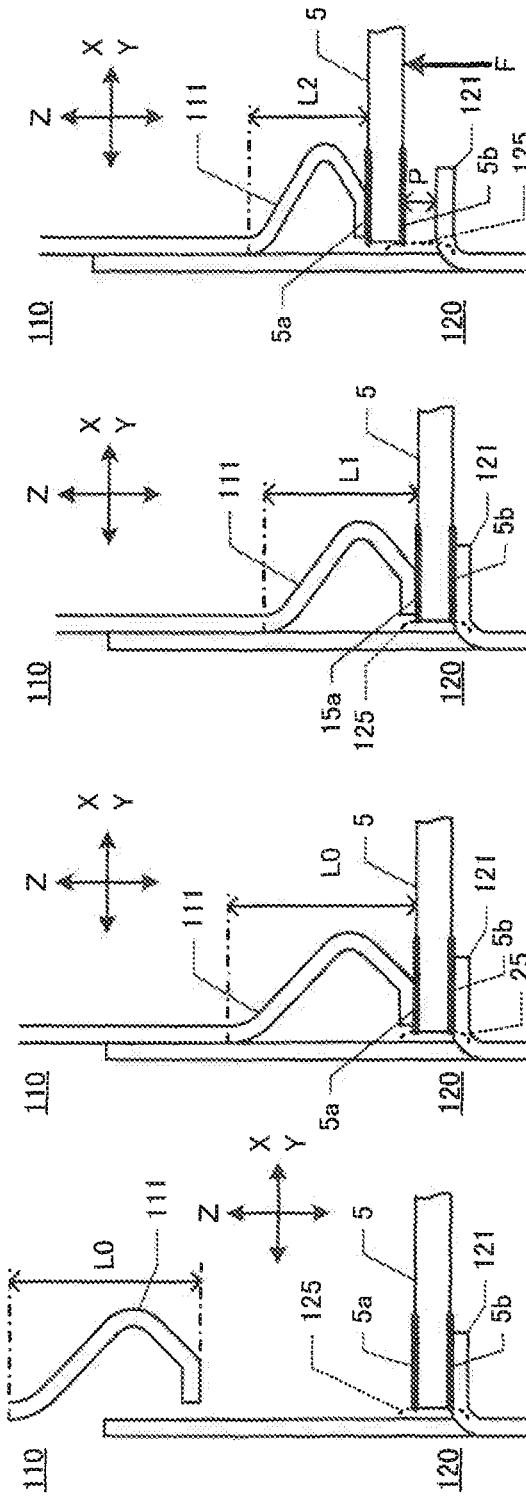

BOARD HOLDING APPARATUS

TECHNICAL FIELD

Related technical fields include board holding apparatus.

BACKGROUND

Conventionally, there is known a technique for fixing an electronic circuit board to a case with screws (e.g., JP 2001-244656 A). In JP 2001-244656 A, a case includes an upper case and a lower case, and the upper case, the lower case, and an electronic circuit board are fastened together with screws.

SUMMARY

However, when an electric circuit board is fixed with screws, a forbidden region needs to be provided on the electric circuit board, causing a problem of not being able to effectively use space on the electric circuit board. For example, there is a need to provide a forbidden region for avoiding screws, bearing surfaces of the screws, and tools for screwing.

Exemplary embodiments of the broad inventive principles described herein provide a board holding apparatus capable of improving the design flexibility of an electric circuit board.

Exemplary embodiments provide a board holding apparatus that holds an electric circuit board between a first case and a second case. The board holding apparatus includes locking parts that lock the first case and the second case together in a thickness direction of the electric circuit board such that the first case and the second case are not separated from each other and a bearing surface formed on the second case, the electric circuit board coming into contact with the bearing surface in the thickness direction. The board holding apparatus includes a spring that generates an elastic force, with the locking parts locking the first case and the second case together, the spring being formed on the first case and the elastic force pressing the bearing surface through the electric circuit board.

In the above-described configuration, by pressing the electric circuit board against the bearing surface by the elastic force of the spring, the electric circuit board can be stably held. Since the electric circuit board is held by the elastic force, some dimensional errors can be absorbed. Since the bearing surface is pressed by the elastic force of the spring through the electric circuit board, the first case provided with the spring and the second case provided with the bearing surface are biased so as to be separated from each other, but the separation between the first case and the second case is restricted by the locking parts. Therefore, with the electric circuit board being pressed, the first case and the second case are securely fixed so as not to be separated from each other. In the above-described configuration, since the electric circuit board can be stably held without being fixed with screws, a forbidden region for disposing screws does not need to be provided on the electric circuit board, enabling to improve the design flexibility of the electric circuit board.

BRIEF DESCRIPTION OF DRAWINGS

FIGS. 5A to 5H are partial cross-sectional views of the board holding apparatus according to the second embodiment.

DESCRIPTION OF EXEMPLARY EMBODIMENTS

Here, embodiments will be described in the following order:

(1) First embodiment;
(2) Second embodiment;
(3) Third embodiment;
(4) Fourth embodiment; and
(5) Other embodiments.

(1) First Embodiment

Figure 1:
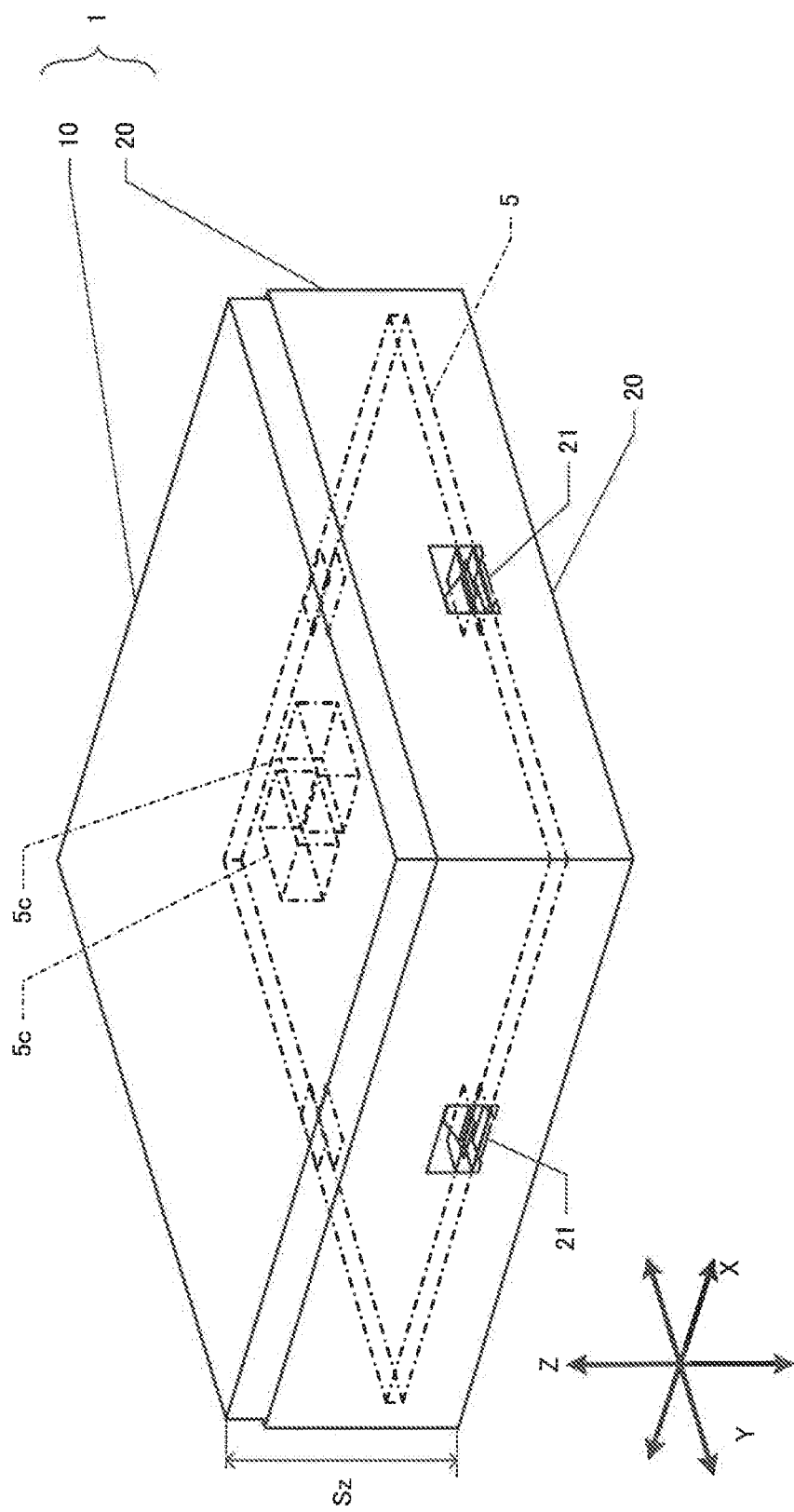
FIG. 1 is a perspective view of a board holding apparatus according to embodiment.

FIG. 1 is a perspective view showing the external appearance of a board holding apparatus 1 according to one embodiment. In the present embodiment, the board holding apparatus 1 is installed on a vehicle. The board holding apparatus 1 is formed in a rectangular parallelepiped shape and includes a first case 10 and a second case 20. The board holding apparatus 1 holds an electric circuit board 5 (dash-dotted lines) in its internal space. It is assumed that a Z-axis is the axis in a thickness direction of the electric circuit board 5 and an X-axis and a Y-axis are the axes in a plane direction of the electric circuit board 5. For convenience of descriptions, one direction and its opposite direction on the Z-axis are represented as an upward direction and a downward direction with reference to the directions shown in the drawing, but the Z-axis direction does not necessarily need to correspond to the upward and downward directions. For example, the board holding apparatus 1 may be installed on the vehicle such that the thickness direction of the electric circuit board 5 is a horizontal direction or a diagonal direction. The electric circuit board 5 has two connectors 5c arranged next to each other in the plane direction, and terminal surfaces of the connectors 5c are exposed outside the board holding apparatus 1. In the present description, only one reference sign is provided for members or parts of the same kind.

In the present embodiment, the electric circuit board 5 is a board that performs processes for controlling the vehicle by communicating with an electronic control unit (ECU) of the vehicle through the connectors 5c. Note, however, that the electric circuit board 5 may be any electric circuit hoard having any function, and the board holding apparatus 1 may be used for other applications than vehicles.

The first case 10 forms the top of the board holding apparatus 1, and the second case 20 forms the bottom of the board holding apparatus 1. The top is a side parallel to the plane direction of the electric circuit board 5 and a side on the top side on the paper. The bottom is a side parallel to the plane direction of the electric circuit hoard 5 and a side on the bottom side on the paper. The top and the bottom are parallel to each other, and the first case 10 and the second case 20 are attached together such that the distance between the top and the bottom in the thickness direction is a reference distance Sz.

Figure 2:
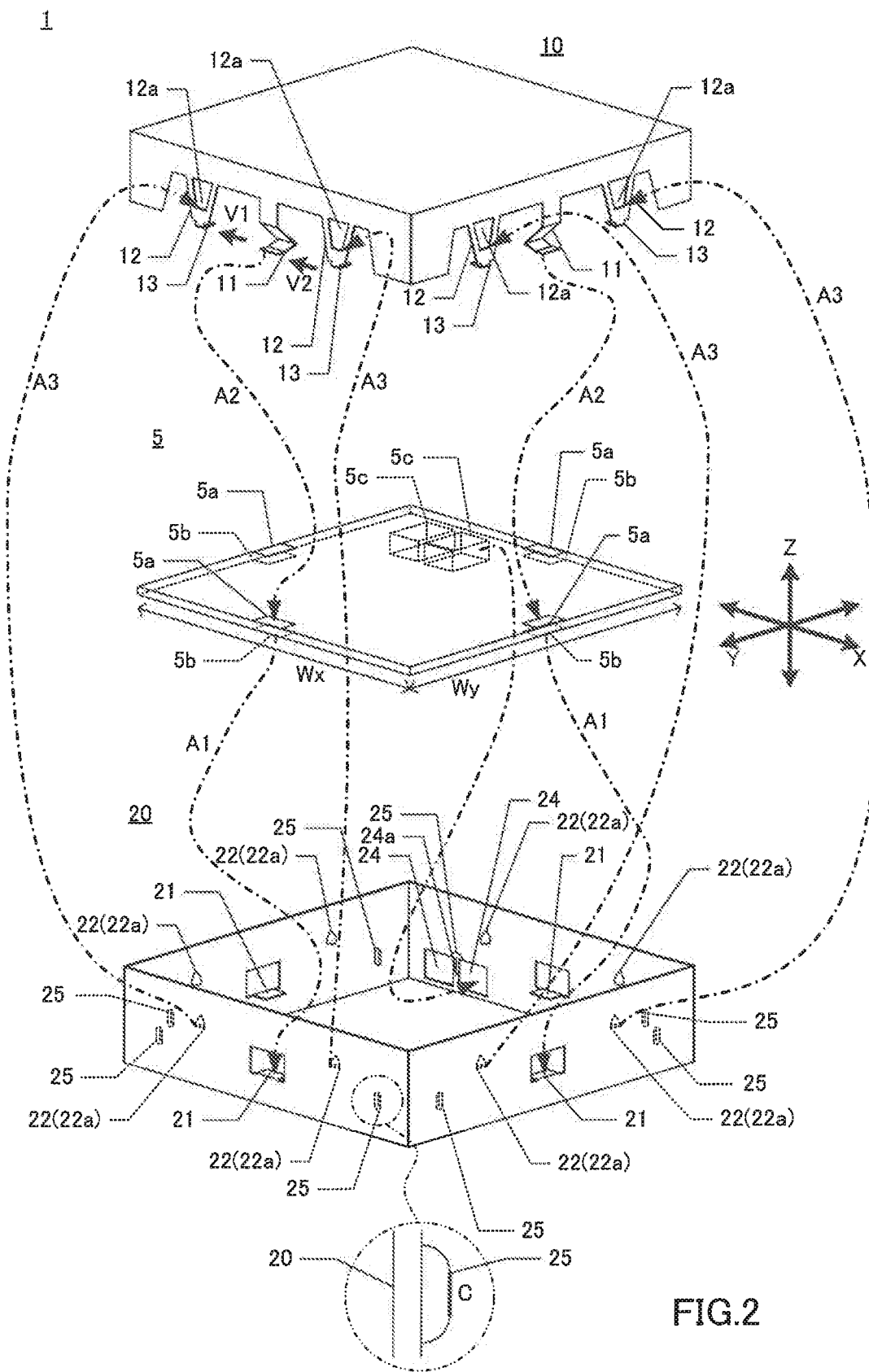
FIG. 2 is an exploded perspective view of the board holding apparatus according to the first embodiment.

FIG. 2 is an exploded perspective view of the board holding apparatus 1. As shown in FIG. 2, the electric circuit board 5 is placed in the second case 20 which forms the bottom of the board holding apparatus 1. Then, the first case 10 which forms the top of the board holding apparatus 1 is attached, from the top, to the second case 20 having the electric circuit board 5 placed therein, by which the board holding apparatus 1 is formed.

FIGS. 3A to 3H are partial cross-sectional views of the board holding apparatus 1. FIGS. 3A, 3C, 3E, and 3G (hereinafter, FIG. 3A, etc.) are views of a part of the board holding apparatus 1 as viewed from an arrow V1 in the X-axis direction shown in FIG. 2, and FIGS. 3B, 3D, 3F, and 3H (hereinafter, FIG. 3B, etc.) are views of a part of the board holding apparatus 1 as viewed from an arrow V2 in the X-axis direction shown in FIG. 2.

First, a detailed configuration of the second case 20 will be described. The second case 20 has a higher elastic modulus than the first case 10, and thus, when the same force acts on the first case 10 and the second case 20. The second case 20 has a smaller elastic deformation distortion than the first case 10. In the second case 20, each part (bearing parts 21, projecting parts 22a, and positioning parts 25 which will be described later) is integrally formed by stamping a flat plate formed of metal. When the second case 20 is not used as an electrical ground, the second case 20 does not necessarily need to be formed of metal. The second case 20 may be formed of, for example, a synthetic resin.

The second case 20 includes a bottom and sides perpendicular to the bottom. There are two sides perpendicular to the X-axis direction and two sides perpendicular to the Y-axis direction. A bearing part 21 is formed at a central portion in the X-axis direction or Y-axis direction of each side. The bearing part 21 is a plate-like part parallel to the bottom of the second case 20 and perpendicular to the side. Each bearing part 21 is formed by providing an upside-down U-Shaped slit in each side of the second case 20 and bending an inner portion of the slit at a right angle toward the center side of the second case 20. As shown in FIG. 1, parts where the bearing parts 21 are formed on the sides of the second case 20 are through-holes that communicate between the inside and outside of the board holding apparatus 1.

Figure 3:
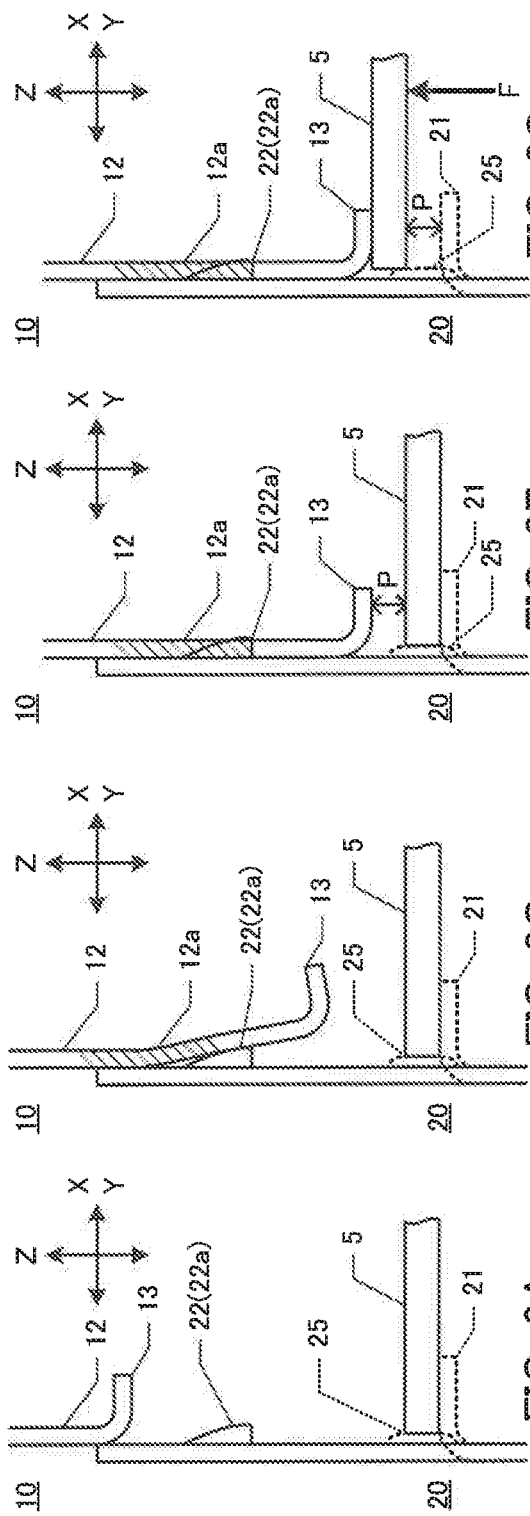
FIGS. 3A to 3H are partial cross-sectional views of the board holding apparatus according to the first embodiment.

On each side of the second case 20, projecting parts 22a serving as second locking parts 22 are formed at locations that sandwich a bearing part 21 from both sides in the X-axis direction or the Y-axis direction. First locking parts 12 of the first case 10 and the second locking parts 22 of the second case 20 are collectively referred to as locking parts 12 and 22. Two projecting parts 22a are formed per side of the second case 20. Each projecting part 22a is formed by extruding a part of a side of the second case 20 toward the center side of the second case 20. As shown in FIG. 3A, etc., the projecting part 22a has such inclination that the width increases toward the center side of the second case 20 as going downward, and a surface parallel to the bottom (in the X-axis direction and the Y-axis direction) is connected at a lower end of the inclination.

On each side of the second ease 20, positioning parts 25 are formed at locations that sandwich projecting parts 22a from both sides in the X-axis direction or the Y-axis direction. Two positioning parts 25 are formed per side of the second case 20. That is, eight positioning parts 25 in total are formed. Each positioning part 25 is formed by extruding a part of a side of the second case 20 toward the center side of the second case 20. An enlarged view of a positioning part 25 as viewed from the X-axis direction is shown in a dash-double-dotted line circle of FIG. 2. As shown in the drawing, the positioning part 25 is formed in trapezoidal shape as viewed from the X-axis direction or the Y-axis direction, and a central portion C (thick line) in the Z-axis direction is parallel to the side. At an upper end of the central portion C, a lower end having such inclination that the width increases toward the center of the second case 20 as going downward is connected. In addition, at a lower end of the central portion C, an upper end having such inclination that the width increases toward the center of the second case 20 as going upward is connected. Furthermore, as indicated by a broken line in FIG. 3B, etc., the height of the lower end of the central portion C is substantially the same as the height of the bearing part 21.

On one side of the second ease 20, two connector insertion holes 24 are made. The connector insertion holes 24 are through-holes made next to each other in the X-axis direction, and a boundary part 24a having an elongated shape in the Z-axis direction is formed between the connector insertion holes 24. Of the eight positioning parts 25, one positioning part 25 is formed by extruding the boundary part 24a toward the center side of the second case 20. Each connector insertion hole 24 is made such that its upper edge position in the Z-axis direction has the same height as that of the bearing part 21.

Next, a detailed configuration of the electric circuit board 5 will be described. The electric circuit board 5 is a rectangular double-sided board, and a downward side in the Z-axis direction is the front side and an upward side in the Z-axis direction is the back side. The two connectors 5c and various types of electronic components (a processor, a RAM, a ROM, etc.) which are not shown are mounted on the front side of the electric circuit board 5. Wiring lines that electrically connect those components are formed on the front side and back side of the electric circuit board 5.

As described above, the plane direction of the electric circuit board 5 is the X-axis direction and the Y-axis direction. The electric circuit board 5 has a shape enclosed by two sides in the X-axis direction and two sides in the Y-axis direction, and the lengths of the two sides in the X-axis direction each are Wx, and the lengths of the two sides in the Y axis direction each are Wy. Four pressed parts are formed on the back side of the electric circuit board 5. The pressed parts are formed at each of central portions of the two sides in the X-axis direction and at each of central portions of the two sides in the Y axis direction. Namely, four pressed parts are formed at the periphery in the plane direction of the electric circuit board 5. The pressed parts are rectangular conductor lands and are ground terminals 5a. The ground terminals 5a are terminals that are electrically connected to ground terminals of various types of electronic components mounted on the electric circuit board 5.

Rectangular ground terminals 5b are also formed on the opposite side (front side) of the ground terminals 5a serving as the pressed parts formed on the back side of the electric circuit board 5. Namely, the ground terminals 5a and the ground terminals 5b which form four sets face each other with the electric circuit board 5 sandwiched therebetween in the thickness direction. As indicated by a dash-dotted line arrow A1 in FIG. 2, the electric circuit board 5 is placed such that each of the four ground terminals 5b comes into contact from above with a corresponding one of the four bearing parts 21 provided on the sides of the second case 20. As shown in FIG. 3B, the ground terminal 5b on the front side of the electric circuit board 5 is in contact with the bearing part 21 from above. With each ground terminal 5b on the front side of the electric circuit board 5 being placed on its corresponding bearing part 21, the plane direction of the electric circuit board 5 becomes parallel to the bottom of the second case 20 and perpendicular to the sides.

As shown in FIG. 2, two positioning parts 25 are formed on one side of the second case 20 perpendicular to the X-axis direction and two positioning parts 25 are formed on the other side of the second case 20 perpendicular to the X-axis direction, and the shortest distance at which the positioning parts 25 formed on those sides face each other in the X-axis direction is larger by a specified amount than the length Wx of the electric circuit board 5 in the X-axis direction. The specific amount is a length that is more desirable to be closer to 0, and is a length set taking into account, for example, dimensional errors of the second case 20 and the electric circuit board 5. Likewise, the shortest distance at which the positioning parts 25 formed on sides in the Y-axis direction face each other in the Y-axis direction is larger by a specified amount than the length Wy of the electric circuit board 5 in the Y-axis direction. Note that the shortest distance at which the positioning parts 25 face each other is the distance between the central portions C (portions parallel to the sides) of the positioning parts 25 in the Z-axis direction.

When the electric circuit board 5 is placed on the bearing parts 21, the edge surfaces of the electric circuit board 5 are located at substantially the same height as that of the central portions C of the positioning parts 25 in the Z-axis direction. Therefore, the electric circuit board 5 is placed on the bearing parts 21, with the electric circuit board 5 positioned sandwiched between the positioning parts 25 in each of the X-axis direction and the Y-axis direction. Note that there may be a case in which the shortest distance at which the projecting parts 22a face each other in the X-axis direction or the Y-axis direction is smaller than the length Wx or Wz of the electric circuit board 5, but by allowing the electric circuit board 5 to go down while the electric circuit board 5 is inclined with respect to the bottom of the second case 20, interference between the projecting parts 22a and the electric circuit board 5 can be avoided. The connectors 5c are mounted such that a part of each connector 5c protrudes in the Y-axis direction from a side in the X-axis direction of the electric circuit board 5, and thus, the electric circuit board 5 is allowed to go down while the electric circuit board 5 is inclined such that the protruding parts are inserted into the connector insertion holes 24. Namely, the electric circuit board 5 is placed in the second case 20 while the electric circuit board 5 is inclined such that the side in the X-axis direction from which the connectors 5c protrude is at a lower position than other portions.

Next, a detailed configuration of the first case 10 will be described. The first case 10 has a lower elastic modulus than the second case 20, and thus, when the same force acts on the first case 10 and the second case 20, the first case 10 has a larger elastic deformation distortion than the second case 20. Specifically, the first case 10 is formed of metal (a stainless steel, a SUP material, etc.) with a large elastic deformation region which is a distortion range allowing elastic deformation. In the first case 10, each part (spring parts 11, first locking parts 12, and protecting parts 13 which will be described later) is integrally formed by stamping a flat plate formed of metal. When the first case 10 is not used as an electrical ground, the first case 10 does not necessarily need to be formed of metal. The first case 10 may be formed of, for example, a synthetic resin.

The first case 10 includes a top and sides perpendicular to the top. There are two sides perpendicular to the X-axis direction and two sides perpendicular to the Y-axis direction. The distance between the outer sides of two sides perpendicular to the X-axis direction of the first case 10 is smaller by a specified very small amount than the distance at which the inner sides of two sides perpendicular to the X-axis direction of the second case 20 face each other. Likewise, the distance between the outer sides of two sides perpendicular to the Y-axis direction of the first case 10 is smaller by a very small amount than the distance at which the inner sides of two sides perpendicular to the Y-axis direction of the second case 20 face each other. The very small amount is a value set taking into account dimensional errors of the first case 10 and the second case 20, and is more desirable to be closer to 0.

A spring part 11 is formed at a central portion in the X-axis direction or Y-axis direction of each side of the first case 10. As shown in FIG. 3B, etc., the spring part 11 is a protruding part that protrudes downward from the side of the first case 10, and is a so-called flat spring. The spring part 11 has such a shape that, when viewed from the X-axis direction or the Y-axis direction, the spring part 11 obliquely bends at a base portion thereof toward the center side in the plane direction of the electric circuit board 5, and obliquely bends at a portion thereof near the center in the Z-axis direction toward the outer side in the plane direction of the electric circuit board 5, and further bends at a lower end thereof in the Z-axis direction toward the outer side so as to be parallel to the plane direction of the electric circuit board 5. The lower end (tip) of the spring part 11 is present in a position shifted more on the center side in the plane direction of the electric circuit board 5 than the side of the first case 10.

As shown in FIGS. 3B and 3D, when an external force is not applied to the spring part 11, the length of the spring part 11 from the upper end to the lower end is L0. The upper end of the spring part 11 is a portion where bending starts at an upper portion of the spring part 11. As shown in FIGS. 3F and 3H, when an external force is applied to the spring part 11, the spring part 11 elastically deforms (contracts) in the Z-axis direction, and the length of the spring part 11 from the upper end to the lower end becomes L1 (L0) and L2 (<L1). The spring part 11 elastically deforms such that the bending angle changes, and a material and a bending shape are designed such that the elastic limit is on the order of twice the load acting when the length from the upper end to the lower end is L2 (the distortion is L0-L2) (the safety factor is twice). When a larger load than the elastic limit acts on the spring part 11, the spring part 11 exceeds the elastic deformation region and plastically deforms, and thus, even if the load is removed, permanent distortion remains.

On each side of the first case 10, first locking parts 12 are formed at locations that sandwich a spring part 11 from both sides in the X-axis direction or the Y-axis direction. Two first locking parts 12 are formed per side of the first case 10. Each first locking part 12 is formed in such a shape that the width gradually decreases from an upper base to a lower end. A recessed part 12a which is a through-hole is made in each first locking part 12. The recessed part 12a has a shape (downsized shape) substantially similar to that of the first locking part 12, and has a size that allows the projecting part 22a to enter the recessed part 12a in a protruding direction (the center side in the plane direction of the electric circuit board 5).

By bending the lower end of each first locking part 12 at a right angle toward the center side of the first case 10, a protecting part 13 is formed. Two protecting parts 13 are formed per side of the first case 10. Each protecting part 13 is formed by bending the tip of the first locking part 12 such that the radius of curvature of a bent portion has a predetermined value (e.g., 1 mm). Namely, the protecting part 13 and the first locking part 12 are formed in a common protruding part that protrudes from the first case 10. Note that the lower end of the spring part 11 is located lower than the protecting part 13.

With the electric circuit board 5 placed in the second case 20 (the bearing parts 21), the first case 10 is set on the second case 20. FIGS. 3A and 3B show a state in which the first case 10 approaches the second case 20 from above. First, as shown in FIG. 3B, the lower end of the spring part 11 enters a position more on the center side in the plane direction of the electric circuit board 5 than the side of the second case 20. Furthermore, when the lower end of the spring part 11 moves downward to a certain extent, the protecting part 13 of the second case 20 reaches the upper edge of the side of the second case 20. At this time, the bent portion of the protecting part 13 of the first ease 10 comes into contact with the upper edge of the side of the second case 20 and slides, by which the first locking part 12 can be guided to the inner side of the side of the second case 20. Namely, each first locking part 12 formed on each of the four sides of the first case 10 is guided to the inner sides of the four sides of the second case 20, and the sides of the first case 10 can be fit on the inner sides of the sides of the second case 20.

When the first case 10 is allowed to go down such that the lower ends of the spring parts 11 further move downward, the lower ends of the spring parts 11 come into contact with the ground terminals 5a on the back side of the electric circuit board 5. FIGS. 3C and 3D show a state in which the lower end of the spring part 11 comes into contact with the ground terminal 5a of the electric circuit board 5. As indicated by a dash-dotted line arrow A2 in FIG. 2, the lower end of the spring part 11 which is bent so as to be parallel to the plane direction of the electric circuit board 5 comes into contact from above with a corresponding one of the ground terminals 5a which are four pressed parts formed at the periphery of the electric circuit board 5. Note that the state shown in FIG. 3D is a state in which the lower end of the spring part 11 has started contacting the ground terminal 5a of the electric circuit board 5, and the length of the spring part 11 from the upper end to the lower end remains L0 (the distortion is 0).

At a stage where, as shown in FIG. 3D, the lower end of the spring part 11 comes into contact with the ground terminal 5a of the electric circuit board 5, the first locking part 12 of the first case 10 interferes with the projecting part 22a of the second case 20 and elastically deforms on the center side in the plane direction of the electric circuit board 5 by being guided by the bent portion of the protecting part 13. As indicated by a dash-dotted line arrow A3 in FIG. 2, each projecting part 22a of the second case 20 interferes with a first locking part 12 of the first case 10. Two projecting parts 22a of the second case 20 are formed on each of the four sides, and each projecting part 22a interferes with a first locking part 12 of the first case 10. The amount of elastic deformation of the first locking part 12 increases as the first locking part 12 further moves downward relative to the projecting part 22a. The shape of the first locking part 12 is designed such that the above-described amount of deformation falls within the elastic deformation region.

Furthermore, when, as shown in FIG. 3E, the first case 10 is allowed to go down, the first locking part 12 moves downward relative to the projecting part 22a until the height of the lower end of the recessed part 12a (hatched) made in the first locking part 12 matches the height of the lower end of the projecting part 22a. When the lower end of the recessed part 12a reaches the lower end of the projecting part 22a, the projecting part 22a can enter the recessed part 12a and the first locking part 12 returns to its original shape.

At this time, the distance between the top of the first case 10 and the bottom of the second case 20 reaches the reference distance Sz. In addition, at this time, although, as shown in FIG. 3F, the lower end of the spring part 11 attempts to move more downward than in FIG. 3D, the lower end of the spring part 11 comes into contact with the electric circuit board 5 placed on the bearing part 21 of the second case 20 and thus is hindered from moving. Hence, the spring part 11 elastically deforms to the extent that the length of the spring part 11 reaches L1 (the distortion is L0-L1), so as to shorten the distance from the upper end to the lower end thereof. As shown in FIG. 3F, in a state in which the length of the spring part 11 reaches L1, an elastic force with a magnitude substantially proportional to the distortion (L0-L1) acts in the Z-axis direction. Namely, the spring part 11 generates an elastic force that presses the bearing part 21 of the second case 20 through the electric circuit board 5. As described above, in FIG. 3F, the elastic force generated in the spring part 11 is within the elastic limit, and the magnitude of the distortion (L0-L1) of the spring part 11 is also within the elastic deformation region.

The elastic force generated by the spring part 11 is a force that separates the first case 10 from the second case 20 upward, but by a wall surface at the lower end of the projecting part 22a of the second case 20 interfering with a wall surface at the lower end of the recessed part 12a made in the first locking part 12 of the first case 10, the first ease 10 is hindered from being separated upward. That is, the projecting part 22a serving as the second locking part 22 of the second case 20 gets into the recessed part 12a of the first locking part 12 of the first case 10, by which the first case 10 and the second case 20 are locked together so as not to be separated from each other. In addition, in a state shown in FIGS. 3E and 3F, the lower end of the spring part 11 of the first case 10 is electrically connected to the ground terminal 5a on the back side of the electric circuit board 5, and the bearing part 21 of the second case 20 is electrically connected to the ground terminal Sb on the front side of the electric circuit board 5. Note that the state shown in FIGS. 3E and 3F is a state in which the attachment of the board holding apparatus 1 is completed.

As shown in FIG. 3E, in a state in which the first case 10 and the second case 20 are locked together so as not to be separated from each other, the back side of the electric circuit board 5 and the protecting part 13 formed at the tip of the first locking part 12 face each other in parallel and the space therebetween is P. Now, a case is considered in which, as shown in FIGS. 3G and 3H, an external force F that pushes the electric circuit board 5 upward from below acts. A force that holds the electric circuit board 5 downward against the external force F is the elastic force of the spring part 11, and when the electric circuit board 5 is pushed upward by an amount corresponding to the space P by the external force F, the length of the spring part 11 becomes L2 (L1-P). As described above, in FIGS. 3G and 3H, the elastic force generated in the spring part 11 is within the elastic limit, and the magnitude of the distortion (L0-L2) of the spring part 11 is also within the elastic deformation region.

Note that the external force F that pushes the electric circuit board 5 upward from below after the attachment of the board holding apparatus 1 includes a force that acts upon connecting external terminals to the connectors 5*c*. In addition, a case is also considered in which an external force F that pushes the electric circuit board 5 upward acts by foreign matter having entered the board holding apparatus 1. Even in a state in which the electric circuit board 5 is pushed upward, a state in which the lower end of the spring part 11 of the first case 10 is electrically connected to the ground terminal 5*a* on the back side of the electric circuit board 5 can be maintained.

In the above-described configuration of the first embodiment, by pressing the electric circuit board 5 against the bearing parts 21 by the elastic forces of the spring parts 11, the electric circuit board 5 can be stably held. Since the electric circuit board 5 is held by the elastic forces, some dimensional errors can be absorbed. Since the bearing parts 21 are pressed by the elastic forces of the spring parts 11 through the electric circuit board 5, the first case 10 provided with the spring parts 11 and the second case 20 provided with the bearing parts 21 are biased so as to be separated from each other, but the separation between the first case 10 and the second case 20 is restricted by the locking parts 12 and 22. Therefore, with the electric circuit board 5 being pressed, the first case 10 and the second case 20 are securely fixed so as not to be separated from each other. In the above-described configuration, since the electric circuit board 5 can be stably held without being fixed with screws, a forbidden region for disposing screws does not need to be provided on the electric circuit board 5, enabling to improve the design flexibility of the electric circuit board 5.

In addition, the spring parts 11 press the pressed parts (ground terminals 5*a* and 5*b*) formed at the periphery of the electric circuit board 5, in the thickness direction. In this configuration, the pressed parts formed at the periphery of the electric circuit board 5 only need to be formed, and thus, the design flexibility of a central portion of the electric circuit board 5 can be improved.

Furthermore, the spring parts 11 and the bearing parts 21 are formed so as to protrude toward the center side of the electric circuit board 5 from the sides of each case 10, 20 that enclose the edge surfaces in the plane direction of the electric circuit board 5. By this, a structure in which the spring parts 11 press the periphery of the electric circuit board 5 can be easily formed. When, as in the present embodiment, the spring part 11 and the bearing part 21 are formed in a beam-like manner in a portion from a side near an edge surface of the electric circuit board 5 to a pressed part at the periphery of the electric circuit board 5, the length of the beam can be reduced and the magnitude of moment acting on the beam can be reduced. Thus, even if a large pressing force acts between the spring part 11 and the bearing part 21, the possibility that the spring part 11 and the bearing part 21 are damaged can be reduced.

In addition, the locking parts 12 and 22 are formed on the sides of each case 10, 20 that enclose the edge surfaces in the plane direction of the electric circuit board 5. By thus forming the locking parts on the sides of each case 10, 20, the locking parts are allowed to be present at the periphery of the electric circuit board 5, enabling to improve the design flexibility of the central portion of the electric circuit board 5.

Furthermore, the projecting part 22*a* is formed in either one of the first locking, part 12 and the second locking part 22, and the recessed part 12*a* is formed in the other one of the first locking part 12 and the second locking part 22 where the projecting part 22*a* is not formed. In addition, the projecting part 22*a* gets into the recessed part 12*a* and is locked by the first locking part 12 or the second locking part 22 returning to its original state from an elastic deformation state. By this, on the sides of each case 10, 20, the locking parts 12 and 22 can be formed in a compact manner using the recessed parts 12*a* and the projecting parts 22*a*, enabling to improve the design flexibility of the electric circuit board 5. In particular, since locking of the first locking part 12 which is a plate-like part in the same direction as the side and the second locking part 22 can be implemented such that they lie on top of each other in their plane directions near the periphery of the electric circuit board 5, the locking parts 12 and 22 can be formed in a compact manner.

In addition, with the first case 10 and the second case 20 being locked together, the spring part 11 elastically deforms and thereby generates an elastic force that presses the projecting part 22*a* against the wall surface of the recessed part 12*a*. By this, the frictional force between the locking parts 12 and 22 can be increased by the elastic force of the spring part 11, enabling to strengthen the fixation of the cases 10 and 20 by the locking parts 12 and 22. In particular, since the projecting part 22*a* and the wall surface of the recessed part 12*a* come into contact with each other perpendicularly relative to the elastic force of the spring part 11, the elastic force of the spring part 11 becomes perpendicular drag and can thereby increase the frictional force.

Furthermore, the first locking part 12 elastically deforms in the plane direction of the electric circuit board 5. Here, the spring part 11 elastically deforms in the thickness direction of the electric circuit board 5, whereas the first locking part 12 elastically deforms in the plane direction of the electric circuit board 5. Namely, since the first locking part 12 and the spring part 11 elastically deform in the directions orthogonal to each other, the mutual influence between the elastic deformations can be reduced. For example, by the spring part 11 displaced by the elastic deformation of the first locking part 12, the possibility of occurrence of a problem that the spring part 11 exceeds the elastic deformation region and deforms can be reduced.

In addition, at least one of the bearing part 21 and the spring part 11 is electrically connected to the ground terminal 5*a*, 5*b* of the electric circuit hoard 5. In this configuration, since the bearing part 21, the spring part 11, and the electric circuit board 5 can be securely brought into contact with each other by the elastic force of the spring part 11, a reliable ground connection can be ensured.

Furthermore, in the configuration of the first embodiment, the spring parts 11 and the first locking parts 12 are integrally formed with the first case 10, and the second locking parts 22 are integrally formed with the second case 20. With the first case 10 and the second case 20 being locked together, the spring part. 11 elastically deforms and thereby generates an elastic force that presses the projecting part 22*a* against the wall surface of the recessed part 12*a*. By thus pressing the projecting part 22*a* against the wall surface of the recessed part 12*a* by the elastic force of the spring part 11, the frictional force between the projecting part 22*a* and the wall surface of the recessed part 12*a* can be increased, enabling to securely lock the first case 10 and the second case 20 together. In the above-described configuration, since the first case 10 and the second case 20 can be securely locked together without being fixed with screws, the number of components can be reduced. Furthermore, since the first locking parts 12 and the spring parts 11 are integrally formed with the first case 10 and the second locking parts 22 are integrally formed with the second case 20, the number of components can be reduced.

In addition, the spring part 11 elastically deforms in a direction in which the first case 10 and the second case 20 are locked together (the thickness direction of the electric circuit board 5), and the first locking part 12 or the second locking part 22 elastically deforms in a direction in which the projecting part 22a gets into the recessed part 12a (the thickness direction of the electric circuit board 5). By thus also integrally forming parts that elastically deform in different directions, the number of components can be reduced.

Furthermore, the recessed part 12a is made in the first locking part 12 and the projecting part 22a is formed in the second locking part 22. By thus not forming the projecting part 22a in which stress concentrates on its corner portions, in the first locking part 12, hard materials can also be adopted as a material of the first case 10 which is integrally formed with the first locking parts 12. Therefore, upon adopting a material having a moderate elastic modulus as a material of the first case 10, also taking into account the mechanical characteristics of the spring parts 11 which are integrally formed with the first case 10, a choice of options for the material can be increased.

In addition, the bearing parts 21 that come into contact with the electric circuit board 5 in the thickness direction are integrally formed with the second case 20. By thus integrally forming the bearing parts 21 with the second case 20, the number of components can be reduced and the stiffness of the bearing parts 21 can be easily improved. By improving the stiffness of the bearing parts 21, the design of the spring parts 11 that takes into account elastic deformation can be facilitated. In the present embodiment, it is assumed that the stiffness of the bearing parts 21 has such a high level that the elastic deformation of the bearing parts 21 can be ignored.

In addition, since the tip of the protecting part 13 faces the electric circuit board 5 in the thickness direction of the electric circuit board 5 with the predetermined space P provided therebetween, the displacement of the electric circuit board 5 in the thickness direction can be restricted. Hence, the amount of deformation of the spring part 11 that generates an elastic force in the thickness direction on the electric circuit board 5 is suppressed, enabling to reduce the possibility that the spring part 11 plastically deforms. Therefore, even if an unintentional force acts on the electric circuit board 5, the holding of the electric circuit board by the spring parts 11 can be maintained.

Furthermore, since the protecting part 13 has such a shape that the width increases as approaching its base, the stress received at the tip from the electric circuit board 5 can be distributed at the base. In addition, since the spring part 11 and the protecting part 13 are integrally formed with the first case 10, the relative positional error between the spring part 11 and the protecting part 13 can be suppressed. Therefore, the displacement of the electric circuit board 5 can be securely restricted in a range in which the spring part 11 does not plastically deform.

In addition, since the first locking part 12 and the protecting part 13 are formed in a common protruding part, installation space for the first locking parts 12 and the protecting parts 13 in the plane direction of the electric circuit board 5 can be reduced, enabling to form the first case 10 in a compact manner.

Furthermore, by pressing the electric circuit board 5 against the bearing parts 21 by the elastic forces of the spring parts 11, the position of the electric circuit board 5 in the thickness direction can be stabilized. In addition, since the spring parts 11 press the electric circuit board 5 in a direction in which a width at which the positioning parts 25 sandwich the electric circuit board 5 in the plane direction decreases, the position of the electric circuit board 5 in the plane direction can also be stabilized by the spring parts 11 pressing the electric circuit board. Thus, a shift in the position of the electric circuit board 5 can be made less likely to occur.

In addition, a positioning part 25 (one of the eight positioning parts 25) is formed within a predetermined distance (e.g., 5 mm) from the connector insertion holes 24 provided in the second case 20. By this, positioning can be performed at a part of the electric circuit board 5 where an external force is applied by performing connector connection work, and a shift in the position of the electric circuit board 5 can be made less likely to occur.

Furthermore, the positioning part 25 is formed at the boundary part 24a between the two connector insertion holes 24 which are provided next to each other in the second case 20. By this, a part of the electric circuit board 5 where an external three is applied by performing connector connection work can be positioned, and a shift in the position of the electric circuit board can be made less likely to occur. In addition, by providing the boundary part 24a, noise leakage can be suppressed.

(2) Second Embodiment

Although, in the first embodiment, the recessed part 12a is made in the first locking part 12 and the projecting part 22a is formed in the second locking part 22, an opposite configuration may be adopted. For example, a projecting part may be formed in the first locking part 12 and a recessed part may be a through-hole made in the second locking part 22. Furthermore, the second locking part 22 may form an exterior wall surface of the board holding apparatus 1.

Figure 4:
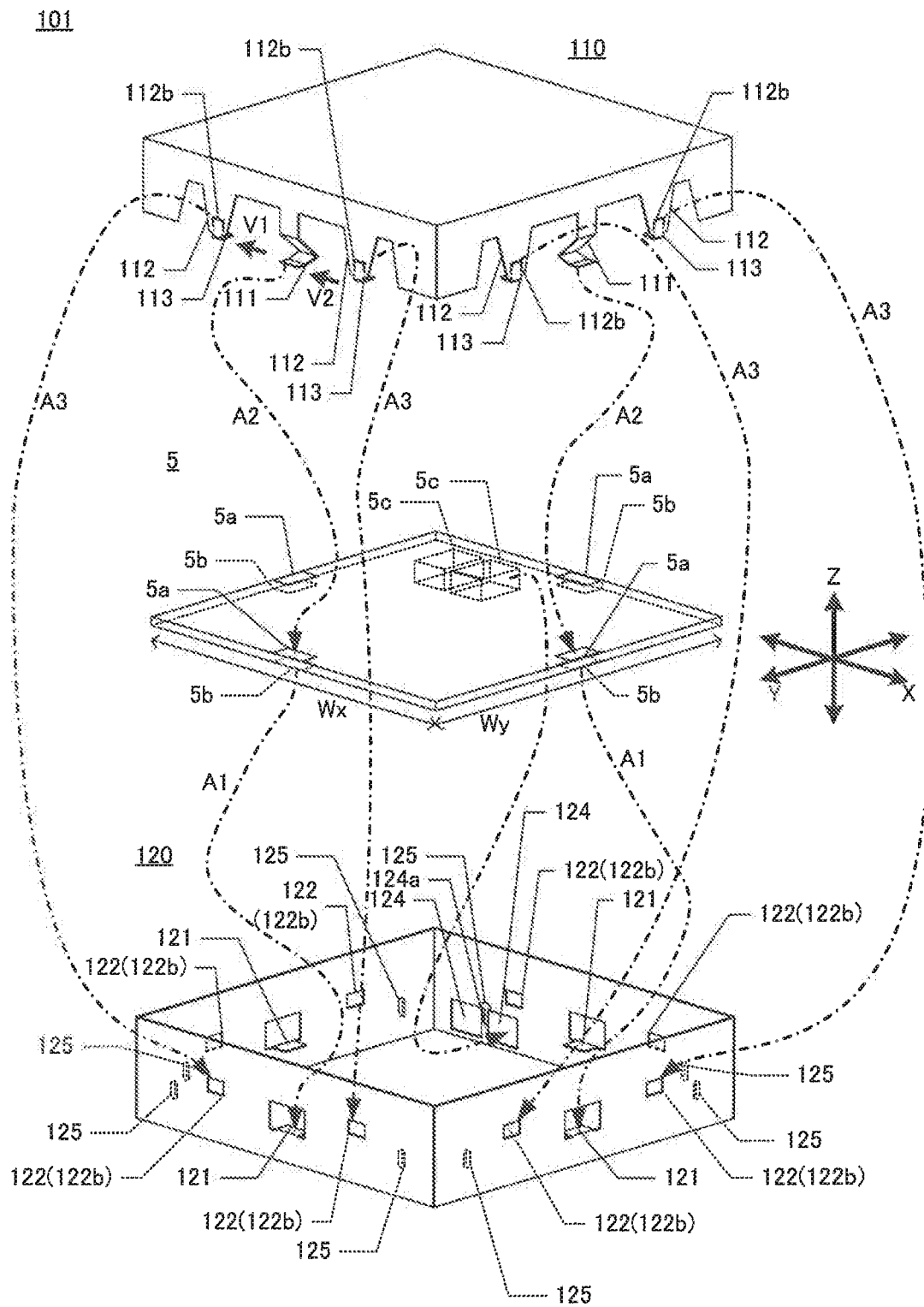
FIG. 4 is an exploded perspective view of a board holding apparatus according to a second embodiment.

FIG. 4 is an exploded perspective view of a board holding apparatus 101 according to a second embodiment. A difference between the second embodiment and the first embodiment is locking parts. As shown in FIG. 4, first locking parts 112 serving as protruding parts are formed on a first case 110 of the board holding apparatus 101, and protecting parts 113 are formed at lower ends of the first locking parts 112. In the second embodiment, instead of the recessed parts 12a, projecting parts 112b are formed in the first locking parts 112. Each projecting part 112b is formed by extruding a part of the first locking part 112 toward the outer side in the plane direction of the electric circuit board 5.

On the other hand, on each side of a second case 120 of the board holding apparatus 101, recessed parts 122b (second locking parts 122) are made at locations corresponding to the projecting parts 112b formed in the first locking parts 112 of the first case 110. Each side of the second case 120 forms an exterior wall surface of the board holding apparatus 1, and the recessed parts 122b are through-holes made in the exterior wall surfaces.

FIGS. 5A to 5H are partial cross-sectional views of the board holding apparatus 101. FIGS. 5A, 5C, 5E, and 5G (hereinafter, FIG. 5A, etc.) are views of a part of the board holding apparatus 101 as viewed from an arrow V1 in the X-axis direction shown in FIG. 4, and FIGS. 5B, 5D, 5F, and 5H (hereinafter, FIG. 5B, etc.) are views of a part of the board holding apparatus 101 as viewed from an arrow V2 in the X-axis direction shown in FIG. 4. The states of a spring part 111 and a bearing part 211 shown in FIG. 5B, etc. are the same as those of the first embodiment shown in FIG. 3B, etc. Each projecting part 112*b* is formed by extruding a part of the first locking part 112 toward the outer side in the plane direction of the electric circuit board 5, and is inclined such that the amount of extrusion is 0 at its lower end and increases as going upward.

As shown in FIG. 5A, the recessed part 122*b* (hatched) which is a through-hole is made in a side of the second case 120 that forms an exterior wall surface of the board holding apparatus 1. As shown in FIG. 5C, when the first locking part 112 having the protecting part 113 formed at its lower end goes down, the projecting part 112*b* which protrudes at the first locking part 112 interferes with the side of the second case 120. By this, the first locking part 112 elastically deforms toward the center side in the plane direction of the electric circuit board 5. Furthermore, as shown in FIGS. 5E and 5F, when the first locking part 112 goes down to the extent that the length of the spring part 111 reaches L1, an upper end of the projecting part 112*b* formed in the first locking part 112 reaches an upper end of the recessed part 122*b* of the second case 120. At this time, the projecting part 112*b* can enter the recessed part 122*b* and the first locking part 112 returns to its original shape.

Even with the adoption of the above-described configuration of the second embodiment, the first case 110 and the second case 120 can be locked together by the first locking parts 112 of the first case 10 and the second locking parts 122 of the second case 20. In the second embodiment, since the projecting part 112*b* gets into the recessed part 122*b* which is a through-hole made in the exterior wall surface of the board holding apparatus 101, and is locked, by seeing an exterior wall surface of the board holding apparatus 101, the state of a projecting part 112*b* having got into a through-hole of the exterior wall surface can be visually identified, enabling to easily check whether the first case 110 and the second case 120 are locked together.

(3) Third Embodiment

Figure 6A:
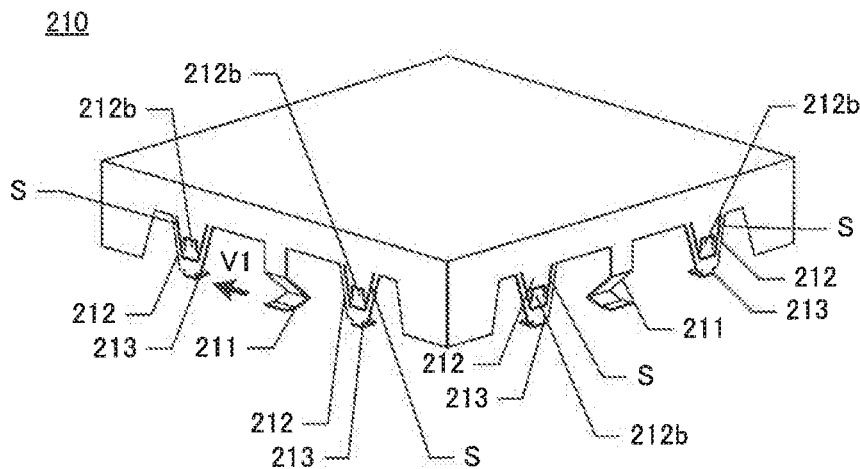
FIG. 6A is a perspective view of a first case according to a third embodiment.

Although, in the first and second embodiments, the entire integrally-formed protruding part including the protecting part 13, 113 and the first locking part 12, 112 elastically deforms, the configuration may be such that only the first locking part 12, 112 elastically deforms. FIG. 6A is a perspective view of a first case 210 according to a third embodiment. In the third embodiment, configurations other than the first case 210 are the same as those of the second embodiment. A difference between the second embodiment and the third embodiment is locking parts.

Figure 6B:
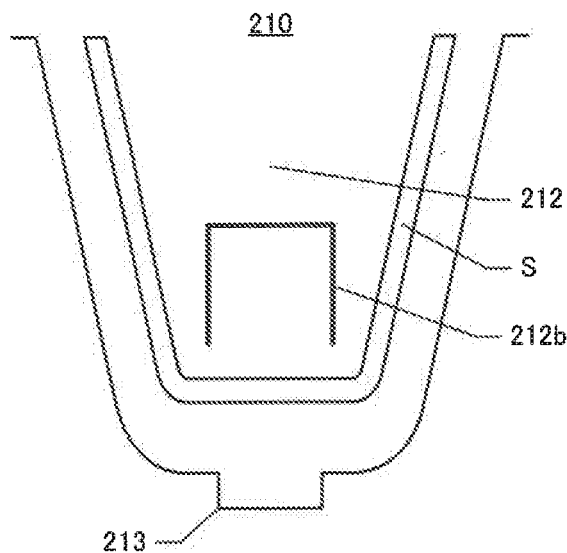
FIG. 6B is a front view of a first locking part according to the third embodiment.

FIG. 6B is a front view of a first locking part 212 according to the third embodiment. As Shown in FIGS. 6A and 6B, protecting parts 213 are formed on the first case 210 so as to protrude downward. By making a U-shaped slit S in the protecting part 213, the first locking part 212 is formed on the inner side of the slit S. The first locking part 212 elastically deforms with its lower end being a free end. A projecting part 212*b* which is the same as that of the second embodiment is formed in the first locking part 212. Here, the first locking part 212 and the protecting part 213 are present coaxially in the Z-axis direction.

Figure 6C:
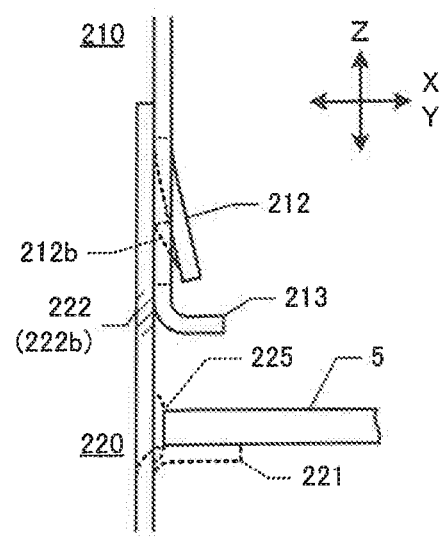
FIG. 6C is a partial cross-sectional view of a board holding apparatus according to the third embodiment.

FIG. 6C is a view of a part of a board holding apparatus as viewed from an arrow V1 in the X-axis direction shown in FIG. 6A.

As shown in FIG. 6C, when the first locking part 212 goes down, the projecting part 212*b* interferes with a side of a second case 220 and the first locking part 212 elastically deforms toward the center side in the plane direction of the electric circuit board 5. A portion on the outer side of the slit S does not have a portion that interferes with the side of the second case 220 and thus maintains a shape of protruding straight downward. Therefore, the protecting part 213 which is a portion on the outer side of the slit S is not substantially displaced. As in the second embodiment, when an upper end of the projecting part 212*b* formed in the first locking part 212 reaches an upper end of a recessed part 222*b* of the second case 220, the projecting part 212*b* can enter the recessed part 222*b* and the first locking part 212 on the inner side of the slit S returns to its original shape.

In the above-described third embodiment, since the first locking part 212 and the protecting part 213 are formed coaxially in the thickness direction of the electric circuit board 5, installation space for the first locking parts 212 and the protecting parts 213 in the plane direction of the electric circuit board 5 can be reduced, enabling to form the first case 210 in a compact manner. In addition, the first locking part 212 is a portion on the inner side of the U-shaped slit S made in the protecting part 213. By thus making the U-shaped slit in the protecting part 213, a portion on the inner side of the slit S can be allowed to independently and elastically deform, and can be formed as the first locking part 212.

Note that for a technique for forming the first locking part 212 and the protecting part 213 coaxially in the thickness direction, other techniques than the formation of the slit S are also considered. For example, the first locking part 212 and the protecting part 213 may be formed as independent protruding parts and disposed side by side in the thickness direction of the electric circuit board 5.

(4) Fourth Embodiment

Figure 7:
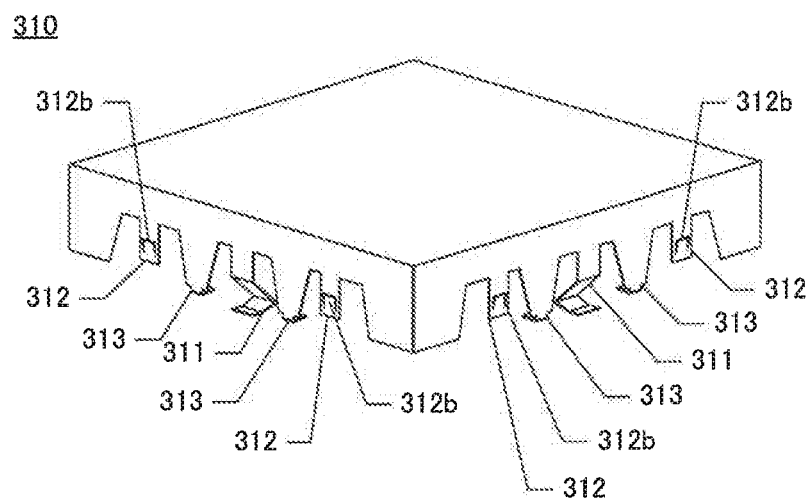
FIG. 7 is a perspective view of a first case according to a fourth embodiment.

FIG. 7A is a perspective view of a first case 310 according to a fourth embodiment. In the fourth embodiment, configurations other than the first case 310 are the same as those of the second embodiment. A difference between the second embodiment and the fourth embodiment is locking parts and protecting parts of the first case 310. In the fourth embodiment, a first locking part 312 and a protecting part 313 are formed as independent protruding parts and are not present coaxially in the Z-axis direction. Even in such a configuration, the first locking part 312 and the protecting part 313 can respectively perform the function of locking and the function of restricting the displacement of the electric circuit board 5.

(5) Other Embodiments

Although, in the above-described embodiments, the number of spring parts 11 (bearing parts 21) is four, the number of spring parts 11 may be other than four (three, or five or more). The larger the number of spring parts 11, the more stably the electric circuit board 5 can be held and the stronger the ground can be made. Needless to say, the numbers of protecting parts 13, locking parts 12 and 22, and positioning parts 25 are not limited to eight, either. Although the above-described embodiments show an example in which the first locking part 12 of the first case 10 elastically deforms and locks with the second locking part 22 of the second case 20, it is also possible to adopt a configuration in which the second locking part 22 of the second case 20 elastically deforms. Furthermore, the protecting parts 13 do not necessarily need to be provided, and it is also possible to adopt a configuration in which the protecting parts 13 are omitted. In addition, when, for example, the accuracy of position in the plane direction of the electric circuit board 5 is not required, the positioning parts 25 may be omitted.

Furthermore, the shape of the positioning part 25 may be any as long as the shape is such that the closer it is to the bearing part 21, the narrower the facing width gets. Thus, the facing width may linearly get narrower or may non-linearly get narrower, or a portion with a constant facing width, as is provided in the first embodiment, may not be provided.

Furthermore, of the spring part 11, the first locking part 12, and the protecting part 13, at least one type may not be integrally formed with the first case 10. For example, elastic moduli required for the spring part 11 and the first locking part 12, respectively, may be achieved by forming the spring part 11 and the first locking part 12 using materials with different elastic moduli. In addition, of the bearing part 21 and the second locking part 22, at least one type may not be integrally formed with the second case 20.

In addition, in a case of, for example, low packaging density of the electric circuit board 5, when there is dead space in a portion other than the periphery of the electric circuit board 5, the dead space may be pressed by the spring part 11. Needless to say, the dead space pressed by the spring part 11 does not need to be a ground terminal.

In addition to the above-described embodiments, the configuration may be any as long as the board holding apparatus holds the electric circuit board between the first case and the second case, and thus, space for accommodating the electric circuit board may be enclosed by the first case and the second case, or the electric circuit board may be held in open space. In addition, the configuration may be any as long as the board holding apparatus includes the first case and the second case, and thus, the hoard holding apparatus may include other cases (members). The board holding apparatus may be installed on, for example, a mobile unit that can cause the board holding apparatus to vibrate, and even if the vibration occurs, the electric circuit board can be stably held. Needless to say, the board holding apparatus may be installed on an apparatus that does not move, etc., or may be used alone without being installed on other apparatuses, etc.

The thickness direction of the electric circuit board is a direction orthogonal to the plane direction of the electric circuit board. The plane direction of the electric circuit board is a two-dimensional direction on a plane orthogonal to the thickness direction of the electric circuit board. The configuration may be any as long as the locking parts lock the first case and the second case together such that the first case and the second case are not separated from each other, and a mechanical structure for locking is not particularly limited. The reference distance is a design distance to be relatively maintained between the first case and the second case. The configuration may be any as long as the bearing parts are formed on the second case, and thus, the bearing parts may be integrally formed with the second case, or members corresponding to the bearing parts may be attached to the second case. The configuration may be any as long as the electric circuit board is placed in the thickness direction on the bearing parts, and the electric circuit board does not necessarily need to be placed from above. Namely, the electric circuit board may approach the bearing parts from below and come into contact with the bearing parts in the thickness direction.

The configuration may be any as long as the spring parts are formed on the first case, and thus, the spring parts may be integrally formed with the first case, or members corresponding to the spring parts may be attached to the first case. The configuration may be any as long as the spring parts are designed to have elasticity with a moderate magnitude, and thus, the spring parts may be formed in a shape that delivers elasticity such as a flat spring or a coil spring, or may be formed of an elastic material having moderate elasticity. The state in which the locking parts lock the first case and the second case together is a state in which the distance between the first case and the second case is maintained at the reference distance. In this state, the distance between the spring part of the first case and the bearing part of the second case is a known distance, the spring part is distorted with a magnitude according to the known distance, and the bearing part is pressed through the electric circuit board by an elastic force with a magnitude according to the distortion. The spring part is designed such that the magnitude of the distortion is within the elastic deformation region. The elastic deformation region is a region for the magnitude of distortion where the spring part returns to its original shape, i.e., the spring part does not plastically deform.

In addition, the spring part may press a pressed part formed at the periphery of the electric circuit board, in the thickness direction. Since the pressed part formed at the periphery of the electric circuit board only needs to be formed, the design flexibility of the central portion of the electric circuit board can be improved. The periphery of the electric circuit board may be, for example, a region within a predetermined distance from the edge surfaces in the plane direction of the electric circuit board, or a region in a position offset toward the center side by a very small distance (e.g., several millimeters) from the edge surfaces. Needless to say, a plurality of pressed parts may be disposed to be uniformly distributed at the periphery of the electric circuit board, so that the pressing forces of the spring parts can act on the electric circuit board in a balanced manner.

Furthermore, the spring part and the bearing part may be formed so as to protrude toward the center side of the electric circuit board from the sides of each case enclosing the edge surfaces in the plane direction of the electric circuit board. By this, a structure in which the spring part presses the periphery of the electric circuit board can be easily formed. Specifically, when the spring part and the bearing part are formed in a beam-like manner in a portion from a side near an edge surface of the electric circuit board to a pressed part at the periphery of the electric circuit board, the length of the beam can be reduced and the magnitude of moment acting on the beam can be reduced. Even if a large pressing force acts between the spring part and the bearing part, the possibility that the spring part and the bearing part are damaged can be reduced. The sides of each case refer to the sides of a housing formed of the first case and the second case.

In addition, the locking parts may be formed on the sides of each case enclosing the edge surfaces in the plane direction of the electric circuit board. By thus forming the locking parts on the sides of each case, the locking parts are allowed to be present at the periphery of the electric circuit board, enabling to improve the design flexibility of the electric circuit board.

Furthermore, the locking parts may include a first locking part provided on the first case; and a second locking part formed on the second case. A projecting part may be formed in either one of the first locking part and the second locking part, and a recessed part may be made in the other one of the first locking part and the second locking part where the projecting part is not formed. Furthermore, the projecting part may get into the recessed part and be locked by the first locking part returning to its original shape from an elastic deformation state. By this, on the sides of each case, the locking parts can be formed in a compact manner using the recessed part and the projecting part, enabling to improve the design flexibility of the electric circuit board.

In addition, with the first case and the second case being locked together, the spring part may elastically deform and generate an elastic force that presses the projecting part against a wall surface of the recessed part. By this, the frictional force between the locking parts can be increased by the elastic force of the spring part, enabling to strengthen the fixation of the cases by the locking parts.

Furthermore, the first locking part may elastically deform in the plane direction of the electric circuit board. Here, the spring part elastically deforms in the thickness direction of the electric circuit board, whereas the first locking part elastically deforms in the plane direction of the electric circuit board. Namely, since the first locking part and the spring part elastically deform in the directions orthogonal to each other, the mutual influence between the elastic deformations can be reduced. For example, by the spring part displaced by the elastic deformation of the first locking part, the possibility of occurrence of a problem that the spring part exceeds the elastic deformation region and deforms can be reduced.

In addition, at least one of the bearing part and the spring part may be electrically connected to a ground terminal of the electric circuit board. Since the bearing part, the spring part, and the electric circuit board can be securely brought into contact with each other by the elastic force of the spring part, a reliable ground connection can be ensured.

The invention claimed is:

1. A board holding apparatus that holds an electric circuit board between a first case and a second case, the board holding apparatus comprising:
   locking parts that lock the first case and the second case together in a thickness direction of the electric circuit board such that the first case and the second case are not separated from each other;
   a bearing surface formed on the second case, the electric circuit board coming into contact with the bearing surface in the thickness direction; and
   a spring that generates an elastic force, with the locking parts locking the first case and the second case together, the spring being formed on the first case and the elastic force pressing the bearing surface through the electric circuit board, the spring pressing a pressed part in the thickness direction, the pressed part being formed at a periphery of the electric circuit board;
   wherein the spring and the bearing surface are formed so as to protrude toward a center side of the electric circuit board from sides of each of the cases, the sides enclosing edge surfaces in a plane direction of the electric circuit board.

2. The board holding apparatus according to claim 1, wherein the locking parts are formed on the sides of each of the cases, the sides enclosing the edge surfaces in the plane direction of the electric circuit board.

3. The board holding apparatus according to claim 2, wherein:
   the locking parts include a first locking part provided on the first case and a second locking part formed on the second case;
   a projecting part is formed in either one of the first locking part and the second locking part, and a recessed part is formed in another one of the first locking part and the second locking part where the projecting part is not formed; and
   the projecting part gets into the recessed part and is locked by the first locking part or the second locking part returning to an original shape from an elastic deformation state.

4. The board holding apparatus according to claim 3, wherein, with the first case and the second case being locked together, the spring elastically deforms and generates an elastic force that presses the projecting part against a wall surface of the recessed part.

5. The board holding apparatus according to claim 4, wherein the first locking part elastically deforms in the plane direction of the electric circuit board.

6. The board holding apparatus according to claim 5, wherein at least one of the bearing surface and the spring is electrically connected to a ground terminal of the electric circuit board.

7. The board holding apparatus according to claim 1, wherein the spring and the bearing surface protrude toward a center side of the electric circuit board from a same side of the first case and the second case.

8. The board holding apparatus according to claim 1, wherein the spring presses the pressed part toward the bearing surface at the same position of the bearing surface in the thickness direction.

9. A board holding apparatus that holds an electric circuit board between a first case and a second case, the board holding apparatus comprising:
   locking parts that lock the first case and the second case together in a thickness direction of the electric circuit board such that the first case and the second case are not separated from each other;
   a bearing surface formed on the second case, the electric circuit board coming into contact with the bearing surface in the thickness direction; and
   a spring that generates an elastic force, with the locking parts locking the first case and the second case together, the spring being formed on the first case and the elastic force pressing the bearing surface through the electric circuit;
   wherein at least one of the bearing surface and the spring is electrically connected to a ground terminal of the electric circuit board.

* * * * *